(12) United States Patent
Goh

(10) Patent No.: US 6,667,560 B2
(45) Date of Patent: Dec. 23, 2003

(54) BOARD ON CHIP BALL GRID ARRAY

(75) Inventor: Jing S. Goh, Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 227 days.

(21) Appl. No.: 08/863,848

(22) Filed: May 27, 1997

(65) Prior Publication Data

US 2002/0000652 A1 Jan. 3, 2002

(Under 37 CFR 1.47)

Related U.S. Application Data

(60) Provisional application No. 60/018,579, filed on May 29, 1996.

(51) Int. Cl.[7] .............................................. H01L 23/48
(52) U.S. Cl. ...................................................... 257/784
(58) Field of Search ........................... 257/784; 438/16, 438/118, 617

(56) References Cited

U.S. PATENT DOCUMENTS

| | | | |
|---|---|---|---|
| 3,179,913 A | 4/1965 | Mittler et al. | |
| 3,370,203 A | 2/1968 | Kravitz et al. | |
| 3,459,998 A | 8/1969 | Focarile | |
| 3,904,934 A | 9/1975 | Martin | 317/101 |
| 4,288,841 A | 9/1981 | Gogal | 361/414 |
| 4,502,098 A | 2/1985 | Brown et al. | 361/383 |
| 4,574,331 A | 3/1986 | Smolley | 361/393 |
| 4,646,128 A | 2/1987 | Carson et al. | 257/74 |
| 4,721,995 A | 1/1988 | Tanizawa | 357/80 |
| 4,727,410 A | 2/1988 | Higgins, III | 357/74 |
| 4,823,233 A | 4/1989 | Brown et al. | 261/383 |
| 4,833,568 A | 5/1989 | Berhold | 361/383 |
| 4,862,249 A | 8/1989 | Carlson | 357/80 |
| 4,868,712 A | 9/1989 | Woodman | 361/388 |
| 4,953,005 A | 8/1990 | Carlson et al. | 357/80 |
| 5,016,138 A | 5/1991 | Woodman | 361/381 |
| 5,019,945 A | 5/1991 | Smolley | 361/412 |
| 5,091,251 A | 2/1992 | Sakumoto et al. | 428/352 |
| 5,148,265 A | 9/1992 | Khandros et al. | 357/80 |
| 5,227,232 A | 7/1993 | Lim | 428/344 |
| 5,235,496 A | 8/1993 | Chomette et al. | 361/764 |
| 5,239,448 A | 8/1993 | Perkins et al. | 361/764 |
| 5,336,928 A | 8/1994 | Neugebauer, deceased et al. | 257/758 |
| 5,384,689 A | 1/1995 | Shen | 361/761 |
| 5,444,296 A | 8/1995 | Kaul et al. | 257/686 |
| 5,491,362 A | 2/1996 | Hamzehdoost et al. | 257/712 |
| 5,523,622 A | 6/1996 | Harada et al. | 257/734 |
| 5,562,971 A | 10/1996 | Tsuru et al. | 428/209 |
| 5,625,944 A | 5/1997 | Werther | 29/843 |
| 5,677,566 A | * 10/1997 | King et al. | |
| 5,683,942 A | * 11/1997 | Kata et al. | |
| 5,777,391 A | * 7/1998 | Nakamura et al. | |
| 5,798,567 A | 8/1998 | Kelly et al. | 257/723 |
| 5,821,605 A | 10/1998 | Hong et al. | 257/668 |
| 5,834,336 A | 11/1998 | Maheshwari et al. | 438/118 |
| 5,846,852 A | 12/1998 | Limper-Brenner et al. | 438/118 |
| 5,866,949 A | 2/1999 | Schueller | 257/778 |
| 5,869,356 A | 2/1999 | Fuller, Jr. et al. | 438/126 |
| 5,886,399 A | 3/1999 | Ohsawa et al. | 257/668 |
| 5,889,333 A | 3/1999 | Takenaka et al. | 257/783 |
| 6,013,946 A | 1/2000 | Lee et al. | 257/684 |
| 6,049,129 A | 4/2000 | Yew et al. | 257/737 |

FOREIGN PATENT DOCUMENTS

| | | |
|---|---|---|
| DE | G 94 17 734.1 | 3/1995 |
| EP | 0 392 242 A2 | 10/1990 |
| EP | 0 698 920 A2 | 2/1996 |
| JP | 58 178529 | 10/1983 |
| JP | 07 321244 | 12/1995 |

* cited by examiner

Primary Examiner—David E. Graybill
(74) Attorney, Agent, or Firm—W. Daniel Swayze, Jr.; W. James Brady; Frederick J. Telecky, Jr.

(57) ABSTRACT

A package for an integrated circuit includes a circuit board 122 for mounting the integrated circuit 114 having a first surface and a second surface, a connection device positioned on the first surface of the circuit board 122 for electrically connecting the integrated circuit 114 and the integrated circuit 114 being positioned on the second surface of the integrated circuit 114.

8 Claims, 4 Drawing Sheets

BOARD ON CHIP BALL GRID ARRAY

This application claims priority under 35 USC §119(e)(1) provisional application No. 60/018,579 filed May 29, 1996.

TECHNICAL FIELD OF THE INVENTION

The present invention relates to packaging semiconductor devices, and more particularly to packaging board on chip (BOC) devices.

BACKGROUND OF THE INVENTION

The semiconductor technology has shown a general trend towards the dramatic increase in integrated circuit speed and density. Both of these trends are fueled by a general reduction in device (active element) geometries. As semiconductor devices becomes smaller, the distances between them on a semiconductor die become, and parasitics (such as parasitic capacitances) and switching currents become smaller. In technologies, such as CMOS, where overall current draw and switching speed characteristics are dominated by the effects of parasitics, the result is a reduction in total power consumption at the same time as switching speed is improved. Overall speed is further improved by the reduction in signal propagation time between active devices (e.g., transistors), resulting from the shorter distances involved. In today's high speed integrated circuitry based on sub-micron geometries, delays in the tens or hundreds of picoseconds can be appreciable.

Typically, integrated circuit dies (chips, or semiconductor dies) are diced (cut apart, or singulated) from a semiconductor wafer and are separated into integrated circuit packages which have pins, leads, solder (ball) bumps, or conductive pads by which electrical connections may be made from external systems to the integrated circuit chip. These packages are then typically applied to circuit board assemblies including systems of interconnected integrated circuit chips.

The aforementioned dramatic improvements in integrated circuit speed and density have placed new demands on integrated circuit assemblies, both at the chip and circuit board levels. Without attendant improvements in these areas, much of the benefit of high device speed is lost. Wiring propagation delays and transmission line effects, in integrated circuit packages and on circuit board assemblies, which were once negligible are now significant factors in the overall performance of systems based on high-speed integrated circuitry. In order to achieve the potential higher system level performance opportunities afforded by the new high density technologies, it is necessary to reduce the amount of signal propagation time between integrated circuits.

Another significant factor in achieving high system level performance is signal drive capability. Longer signal paths are susceptible to noise, cross-talk, etc., and require low impedance, high current drive circuits on the integrated circuit chips (dies). Such circuits tend to occupy large portions of the die area, either reducing the area available for other circuitry or increasing the overall die size, and can introduce significant delays of their own. Clearly, shorter signal paths and their attendant low signal drive current requirements are desirable to achieve high performance.

In the prior art, a number of high density chip assemblies and packages have been proposed and implemented. One such technique is commonly known as "chip-on-board" technology, whereby integrated circuit dies are bonded directly to die mounting areas on a circuit board substrate, for example, ceramic, fiberglass, etc., and are wire bonded (with thin "bond wires") to traces on the circuit board in areas adjacent to the edges of the dies. The elimination of the traditional integrated circuit package permits chips to be placed much closer together than would otherwise be possible, thereby shortening signal paths and reducing delays.

SUMMARY OF THE INVENTION

The present invention reduces inductance that is induced between wires and internal leads. Additionally, the present packaging arrangement provides one package for all applications. The package for the present invention provides short traces leading to favorable impedance coupling. These short wires are designed to reduce electrical impedance important for the operation of high speed devices, such as the synchronous DRAM. Additionally, the present invention eliminates wire shorts to the bus bar and eliminates T/F. Additionally, the present invention eliminates the use of ultra-advance molding equipment development. Additionally, the present invention provides a true chip size package, which leads to improved mapping density. Additionally, the present invention eliminates the bent leads. Lastly, the present invention eliminate noise due to cross-talk and improves the delays associated with longer wires.

The present invention includes a package for an integrated circuit, including a circuit board for mounting the integrated circuit having a first surface and a second surface, a connector device positioned on the first surface of the circuit board for electrically connecting the integrated circuit, and the integrated circuit being positioned on the second surface.

DETAILED DESCRIPTION OF THE INVENTION

Figure 1:
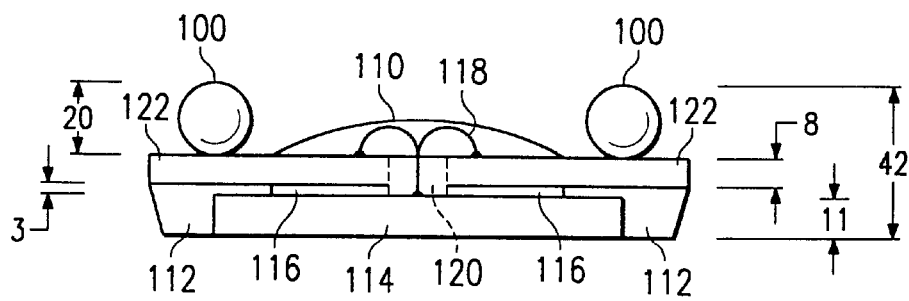
FIG. 1 illustrates a sideview of package die with potting topside.

FIG. 1 illustrates that solder balls 100 are positioned along the longitudinal edges of printed circuit board 122. To provide the maximum spacing between the individual solder balls, the solder balls may be positioned along the outer edges of the printed circuit board 122. The number of the solder balls 100 correspond to the number of connections to the semiconductor die 114. The semiconductor die 114, which has been previously cut or diced is mounted to the printed circuit board 122 by an attachment apparatus, for example, polymide tape or any adhesive material suitable to attach the semiconductor die 114 to the printed circuit board 122. Advantageously, the semiconductor die 114 is the type with connections along the longitudinal axis of the semiconductor die. The electrical connection may be positioned along the central axis of the semiconductor die 114. The solder balls 100 are connected to the semiconductor die 114 by wires 118 which may be made of material gold and traces (not. shown). These wires 118 are attached to the semiconductor die on the side of the semiconductor die 114 that faces or abuts the printed circuit board 122. The wires 118 extend from the semiconductor die 114 through a hole 120 of the printed circuit board and are attached to traces which run along or through the printed circuit board to the solder balls. The hole through the printed circuit board 122 may be positioned at the central longitudinal axis of the printed circuit. The semiconductor die 114 and wires 118 are protected from external objects by the elements by sealing material, such as the epoxy resin to form the chip-on-board (COB) semiconductor device. Although, top and bottom have no absolute meaning, for purposes of this application, the side of the printed circuit board 122 with the solder balls 100 and away from the semiconductor die 114 is referred as the top portion while the bottom portion of the printed circuit board 122 is the side opposite to the solder balls 100 and the same side as the semiconductor die 114.

The sealing material 110, which is formed on the top surface of the printed circuit board 114 to cover the wires 118 and the hole 120 protects the wires and has a general curved shape. The bottom sealing material 112 forms between the printed circuit board 122 and the semiconductor die 114 to encapsulate the adhesive means 116 and the wires 118 and further encapsulate the sides of the semiconductor die 114. The bottom of the bottom sealing material 112 is approximately flush with the bottom of the semiconductor die 114.

Figure 2:
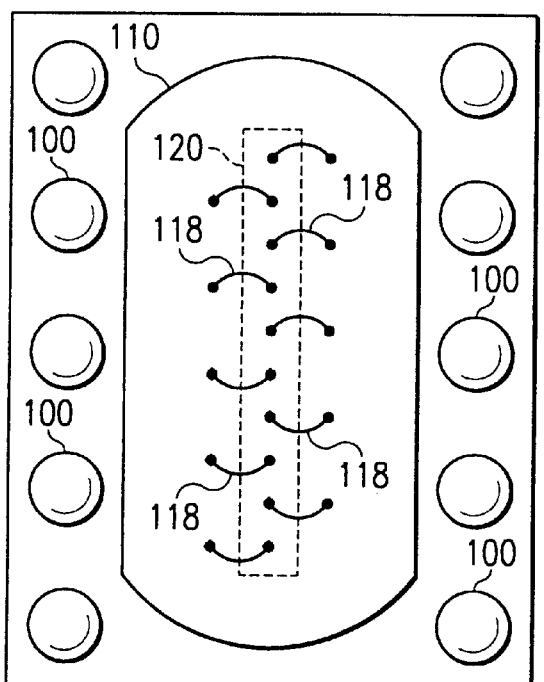
FIG. 2 illustrates a topview of the package with a stitch design.

FIG. 2 illustrates that the top sealing material 110 is formed around the wires 118 and are generally perpendicular to the longitudinal axis of the printed circuit board 122. The height of the packaged device is very compact and approximately only 42 mills. The wires 118 are very short and eliminate inductance. The height between the bottom of the printed circuit board 122 and the bottom of the semiconductor die 114 is approximately 14 mills while the height from the top of the printed circuit board 122 to the top of the solder balls 100 is approximately 20 mills. The semiconductor die 114 is spaced approximately 1 to 3 mils from the bottom of the printed circuit board 122 depending on the type/method of die attached used.

Figure 3:
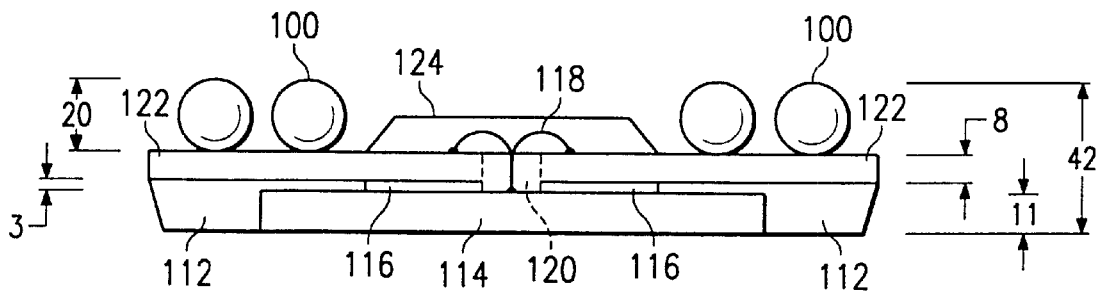
FIG. 3 illustrates a sideview of another package die with molding topside.
Figure 4:
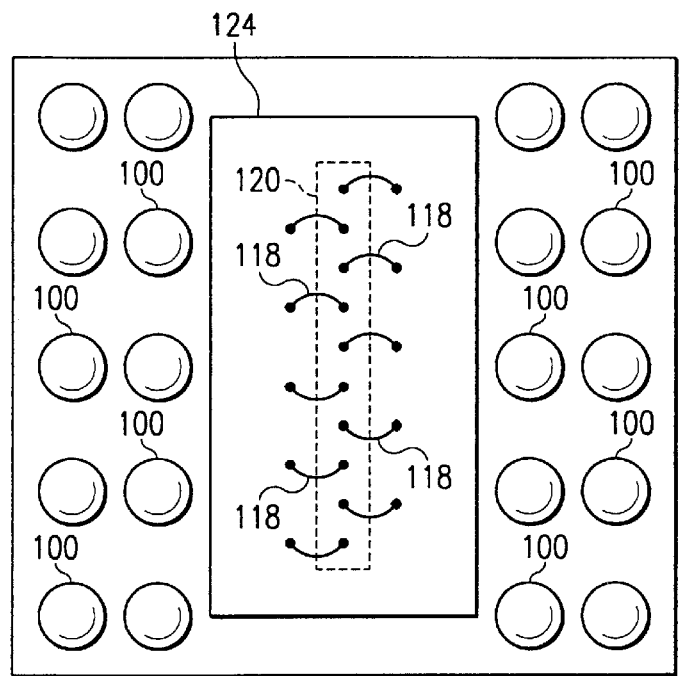
FIG. 4 illustrates the topview of the same package die.

FIG. 3 illustrates a variation of the package of FIGS. 1 and 2, in that the top sealing material 124 has more angular shape with sloping sidewalls. The topview illustrates that the sealing material 124 has an approximately rectangle shape.

Figure 5:
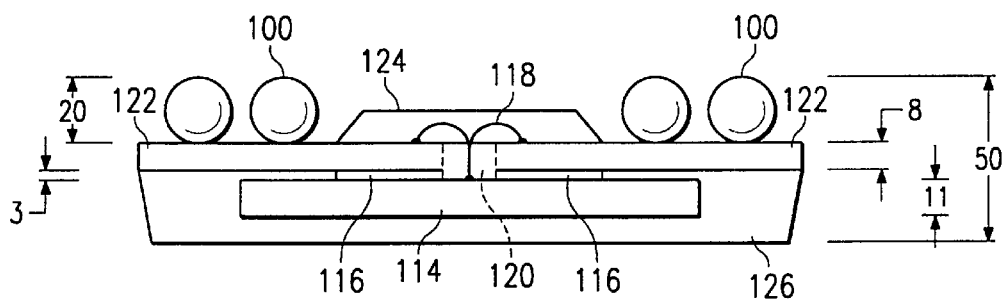
FIG. 5 illustrates another package die with molded topside.

Turning now to FIG. 5, FIG. 5 illustrates that the bottom sealing material 126 is not flush with the bottom of the semiconductor die 114 and entirely encapsulates the semiconductor die 114 including the bottom surface of the semiconductor die 114. This improves the protection of the semiconductor die 114, but increases the overall height to approximately 50 mills.

Figure 6:
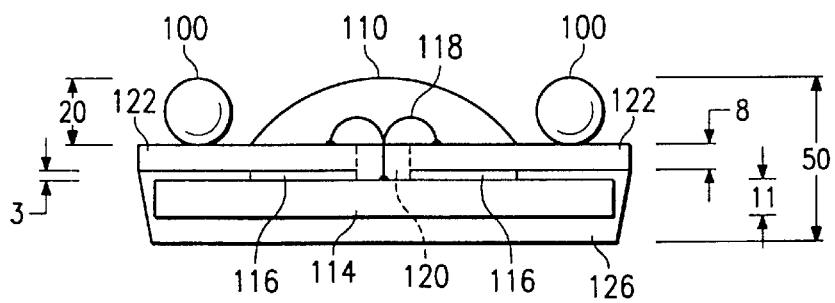
FIG. 6 illustrates a variation of the package of FIG. 5 with potter topside.

FIG. 6 illustrates that the top sealing material is a curved top sealing material 110. The overall height of this package is approximately 50 mils.

Figure 7:
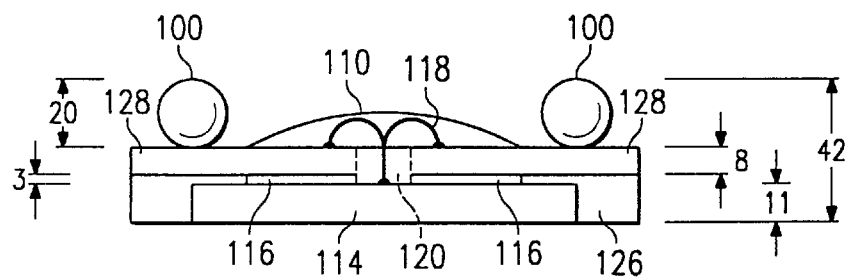
FIG. 7 illustrates another sideview of another package with potter topside.

FIG. 7 illustrates that the semiconductor die 114 is not enclosed on either the bottom or sides by a sealing material. The adhesive material 116 extends from the hole 120 to the outermost side of the printed circuit board 122. This extension of the adhesive material 116 provides a stable mounting platform for the semiconductor die 114.

Figure 8:
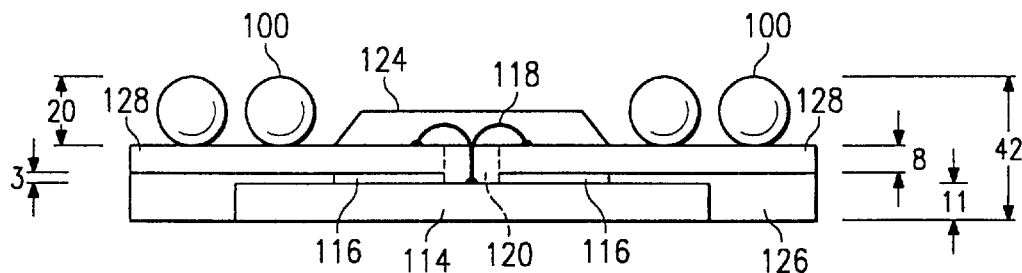
FIG. 8 illustrates another sideview of another package die with molding topside.

In FIG. 8, the angular top sealing material 124 is used with the extended adhesive material 116. The dimensions of the semiconductor die 114 are approximately the same as the printed circuit board 122 along the longitudinal axis of the printed circuit board 122.

Figure 9:
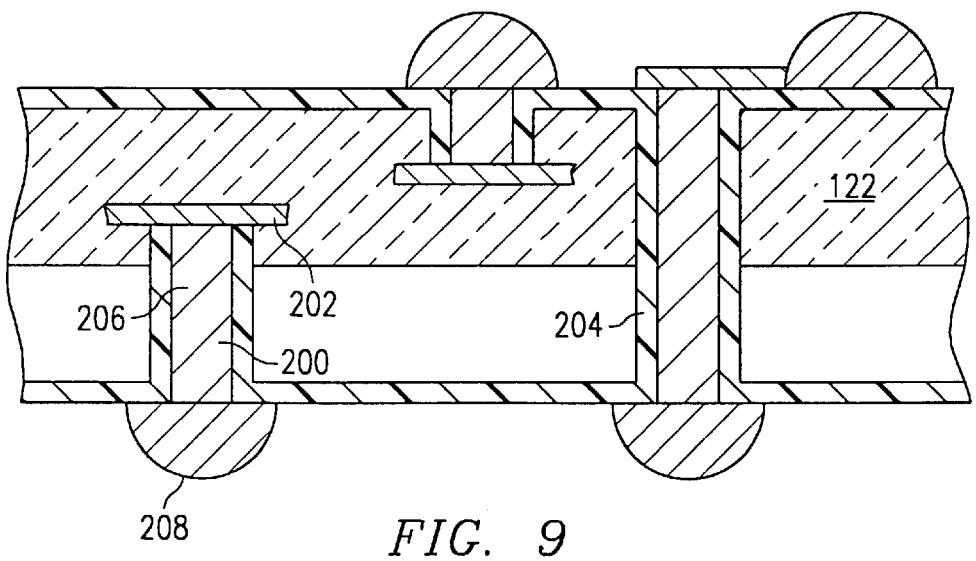
FIG. 9 illustrates the board and solder bumps.
Figure 10:
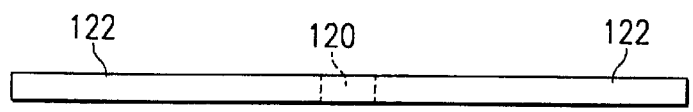
FIGS. 10–14 illustrates a process of the present invention.
Figure 11:
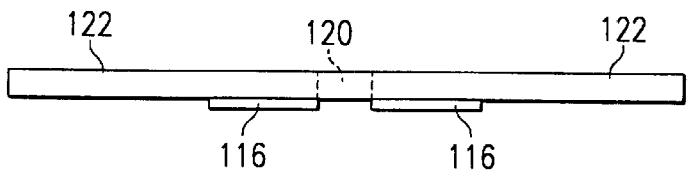

FIG. 9 illustrates a construction in the form of a structure of the printed circuit board 122 with the solder balls. The structure includes a hole 200 formed by etchings other suitable process and extends from the top surface of the printed circuit board 122 into the printed circuit board 122 down to and exposing conductor 202. Conductive material 204, for example, gold or copper is plated on the walls of the hole 200. A conductive plug 206 is deposited in to hole 200 forming a conductive via from the surface of the printed circuit board 122 to the conductor 202. Contact 208 is electrically conductive to plug 206 and is formed on the top surface of the printed circuit board.

FIGS. 10–14 illustrates a process for the construction of device in accordance with the principals of the present invention.

Figure 12:
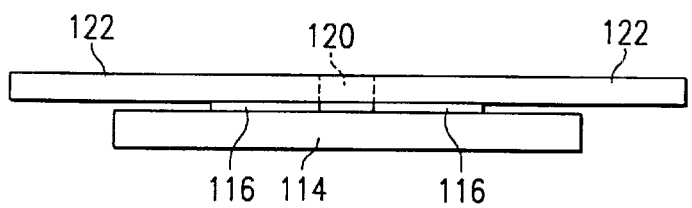

A hole 120 is formed along the central longitudinal axis of the printed circuit board 122. Adjacent to the hole 120 and on the bottomside of the printed circuit board 122, adhesive material 116 is placed. Semiconductor die 114 is positioned next on the adhesive means 116 as illustrated in FIG. 12.

Figure 13:
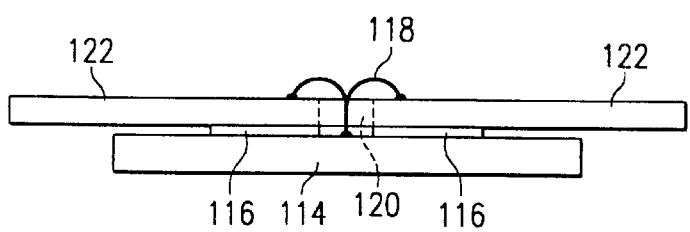
Figure 14:
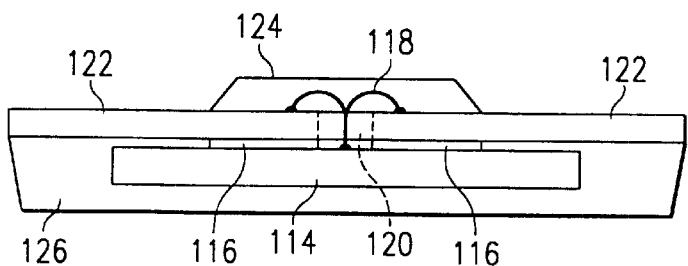

In FIG. 13, wires 118 are formed from the semiconductor die 114 to the conductors located in the printed circuit board 122 by wire bonding machines (not shown). As illustrated in FIG. 14, a top sealing material 124 protects the wires while a bottom sealing material 126 protects the semiconductor die. These top and bottom sealing materials are formed by molding machine (not shown). Thus, the wires are very short and eliminate inductance resulting from longer wires and provides favorable impedants and coupling to the semiconductor die. Furthermore, no bus bar is needed.

The present invention further eliminates or minimizes bent leads resulting from the wire placement process.

What is claimed:

1. A package for an integrated circuit having wires for electrial connection, comprising:
    a circuit board for mounting the integrated circuit having a first surface and a second surface;
    a connector device positioned on the first surface of the circuit board for electrically connecting the integrated circuit by said wires;
    said integrated circuit being positioned on the second surface of said circuit board; and
    said wires being centrally positioned on said integrated circuit to abut said first surface of the circuit board.

2. A package for an integrated circuit, as in claim 1, wherein said integrated circuit is attached to said circuit board by epoxy.

3. A package for an integrated circuit, as in claim 1, wherein said integrated circuit is attached to said circuit board by adhesive tape.

4. A package for an integrated circuit, as in claim 3, wherein said adhesive tape is polymide tape.

5. A package for an integrated circuit, as in claim 1, wherein said circuit board has a hole to place wires to connect the integrated circuit and said connection device.

6. A package for an integrated circuit, as in claim 1, wherein said connection device includes a solder ball.

7. A package for an integrated circuit, as in claim 1, wherein the package further comprises:
    a sealing material to seal the integrated circuit, and wherein the sealing material form a flush surface with a surface of the integrated circuit.

8. A package for an integrated circuit, as in claim 1, wherein the package further comprises a sealing material to completely encapsulate the integrated circuit.

* * * * *